United States Patent
Lien et al.

(10) Patent No.: US 8,769,178 B2
(45) Date of Patent: Jul. 1, 2014

(54) SHOCK TEST DEVICE

(75) Inventors: Chin-Lung Lien, Taipei (TW); Wei-i Chen, Taipei (TW); Kuei-Hua Chen, Taipei (TW)

(73) Assignee: Inventec Corporation, Taipei (TW)

(\*) Notice: Subject to any disclaimer, the term of this patent is extended or adjusted under 35 U.S.C. 154(b) by 349 days.

(21) Appl. No.: 13/291,789

(22) Filed: Nov. 8, 2011

(65) Prior Publication Data

US 2013/0061682 A1    Mar. 14, 2013

(30) Foreign Application Priority Data

Sep. 8, 2011  (TW) .............................. 100132437 A

(51) Int. Cl.
*G06F 13/00* (2006.01)
*H05K 7/10* (2006.01)
*G06F 3/00* (2006.01)

(52) U.S. Cl.
USPC ............. 710/301; 710/300; 710/302; 710/15

(58) Field of Classification Search
CPC .......................... G06F 13/4081; G06F 13/409
USPC ...................................... 710/300–302, 15–17
See application file for complete search history.

(56) References Cited

U.S. PATENT DOCUMENTS

| | | | | |
|---|---|---|---|---|
| 5,922,060 A | * | 7/1999 | Goodrum | 710/302 |
| 5,954,205 A | * | 9/1999 | Smith | 209/2 |
| 6,493,782 B1 | * | 12/2002 | Verdun et al. | 710/300 |
| 6,687,777 B2 | * | 2/2004 | Verdun et al. | 710/300 |
| 7,849,234 B2 | * | 12/2010 | Lin et al. | 710/15 |
| 2003/0110337 A1 | * | 6/2003 | Verdun et al. | 710/303 |
| 2004/0078676 A1 | * | 4/2004 | Chi et al. | 714/33 |
| 2005/0289274 A1 | * | 12/2005 | Ghercioiu et al. | 710/303 |

\* cited by examiner

*Primary Examiner* — Lisa Caputo
*Assistant Examiner* — Jonathan Dunlap
(74) *Attorney, Agent, or Firm* — CKC & Partners Co., Ltd.

(57) ABSTRACT

The invention provides a shock test device suitable for an expansion slot of a computer system. The shock test device includes a mainboard, a structure unit and a detection module. The mainboard has a connecting finger electrically connected to the expansion slot. The structure unit is disposed at the mainboard for simulating a weight and a supporting structure. The detection module is coupled to at least one pin of the connecting finger for detecting a touch condition between the connecting finger and the expansion slot so as to produce a warning signal. In this way, the shock test device can detect whether or not a link plug-in in a host computer (for example, the link between the expansion slot and the connecting finger portion of the shock test device) is disconnected due to shocking or unseen disconnected and then reconnected again.

8 Claims, 3 Drawing Sheets

SHOCK TEST DEVICE

CROSS-REFERENCE TO RELATED APPLICATION

This application claims the priority benefit of Taiwan application serial no. 100132437, filed Sep. 8, 2011. The entirety of the above-mentioned patent application is hereby incorporated by reference herein and made a part of this specification.

BACKGROUND OF THE INVENTION

1. Field of the Invention

The invention generally relates to a test technique, and more particularly, to a shock test device suitable to an expansion slot of a computer system.

2. Description of Related Art

The current host computer architecture includes a central process unit (CPU), a bridge chipset, a memory and a display unit, and additionally, includes expansion slots for expanding the computer function by a user. The expansion slot plays a quite important role in a computer for expanding the computer function, so that a user can use the expansion slot of a host computer for communication with peripheral devices (external card, for example, graphic card, sound card and the like) so as to expand the computer function and the application of the host computer.

In addition to wishing smoothly operating a computer in immobile state, the user also wishes to carry a host computer for usage convenience. In this regard, the manufacturers must test the stability of a host computer during shock at all times so as to check whether or not the host computer can normally run under a moving simulation situation.

Since the external card has various types, and the part number, part weight and supporting structure design of each external card is different from one another, so that the manufacture is hard to take advantage of a real external card to perform testing job during vibration test. In fact, if a manufacturer wants to do the above-mentioned job against real cards, a lot of various external cards must be available so as to conduct overall and integrated testing.

However, the cost for the above-mentioned test way against real external cards is overwhelming high. In addition, the above-mentioned test way is unable to detect out a possible real escape of the connecting finger thereof from the expansion slot. Based on the above-mentioned reason, a novel test technique must be developed to solve the above-mentioned problem during checking the stability of a host computer under shocking.

SUMMARY OF THE INVENTION

Accordingly, the invention is directed to a shock test device for detecting whether or not a link plug-in (for example, an expansion slot and a connecting finger portion of the shock test device) is disconnected due to shocking or a connecting finger of the shock test device is unseen disconnected and then reconnected back or so on.

The invention provides a shock test device suitable for an expansion slot of a computer system. The shock test device includes a mainboard, a structure unit and a detection module. The mainboard has a connecting finger electrically connected to the expansion slot. The structure unit is disposed at the mainboard for simulating a weight and a supporting structure. The detection module is coupled to at least one pin of the connecting finger for detecting a touch condition between the connecting finger and the expansion slot so as to produce a warning signal.

In an embodiment of the present invention, the above-mentioned structure unit includes at least one weight and at least one frame. The at least one weight is for simulating the weight of the shock test device and the at least one frame is for simulating the supporting structure of the shock test device and a mainboard height of the shock test device.

In an embodiment of the present invention, the above-mentioned detection module includes a touch-detecting unit, a latch unit and a warning unit. The touch-detecting unit is coupled to the at least one pin for enabling a touch condition signal when the at least one pin is disconnected from the expansion slot. The latch unit is coupled to the detection module for receiving the touch condition signal and enabling and keeping a latch warning signal when the touch condition signal is enabled. The warning unit is coupled to the touch-detecting unit and the latch unit for producing the warning signal when the touch condition signal is enabled or the latch warning signal is enabled.

In an embodiment of the present invention, the at least one pin of the above-mentioned connecting finger is for coupling at least one ground pin of the expansion slot. The touch-detecting unit includes a first OR-gate and at least one pull-up resistor. Each of the input terminals of the first OR-gate is respectively coupled to the at least one pin of the connecting finger and the output terminal of the first OR-gate produces the touch condition signal. The first terminal of each of the pull-up resistors is coupled to a power terminal and the second terminal of each of the pull-up resistors is respectively coupled to the at least one pin.

In an embodiment of the present invention, the above-mentioned latch unit includes a D-type flip-flop. A data input terminal of the D-type flip-flop is coupled to a power terminal, a clock input terminal thereof receives the touch condition signal and a data output terminal thereof produces the latch warning signal.

In an embodiment of the present invention, the above-mentioned warning unit includes a first NOT-gate, a second NOT-gate, a first diode, a second diode, a first resistor and a first LED. The input terminal of the first NOT-gate receives the touch condition signal and the input terminal of the second NOT-gate receives the latch warning signal. The cathode terminal of the first diode is coupled to the output terminal of the first NOT-gate and the cathode terminal of the second diode is coupled to the output terminal of the second NOT-gate. The first end of the first resistor is coupled to the cathode terminals of the first diode and the second diode. The cathode terminal of the first LED is coupled to the second end of the first resistor and the anode terminal of the first LED is coupled to the power terminal.

In an embodiment of the present invention, the above-mentioned warning unit further includes a touch displaying unit coupled to the first NOT-gate and an inverting data output terminal of the latch unit for sending out a touch signal when the touch condition signal or the latch warning signal is disabled.

In an embodiment of the present invention, the above-mentioned touch displaying unit includes a second OR-gate, a third NOT-gate, a third diode, a second resistor and a second LED. The first input terminal and the second input terminal of the second OR-gate are respectively coupled to the output terminal of the first NOT-gate and the inverting data output terminal to produce a touch displaying signal. The third NOT-gate is for inverting the touch displaying signal. The cathode terminal of the third diode is coupled to the output terminal of the third NOT-gate. The first end of the second resistor is coupled to the cathode terminal of the third diode. The cathode terminal of the second LED is coupled to the second end of the second resistor and the anode terminal of the second LED is coupled to the power terminal.

In an embodiment of the present invention, the above-mentioned shock test device further includes a power supply module for providing an input power at the power terminal of the shock test device.

In an embodiment of the present invention, the above-mentioned expansion slot conforms to a peripheral component interconnect express (PCI-E) specification.

Based on the above description, in the shock test device of the embodiments of the invention, hardware components of the weight and the frame are used to simulate the weight of the external card and the supporting structure, and the detection module is used for detecting whether or not a link plug-in in a host computer is disconnected due to shocking or the connecting finger of the shock test device is unseen disconnected and then reconnected back or so on. In particular, when the connecting finger of the shock test device is disconnected due to shocking, a warning signal is produced to inform the tester.

In order to make the aforementioned and other features and advantages of the invention comprehensible, several exemplary embodiments accompanied with figures are described in detail below.

DESCRIPTION OF THE EMBODIMENTS

Figure 1:
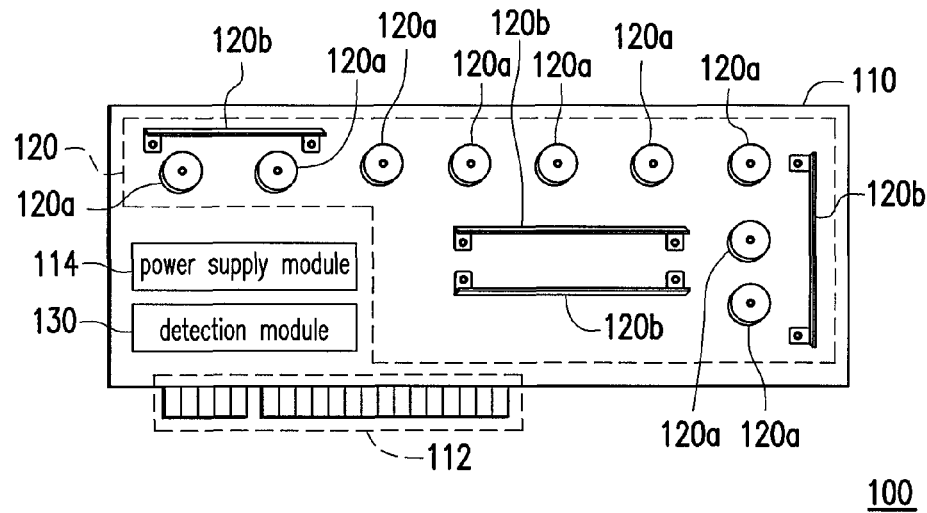
FIG. 1 is a schematic diagram of a shock test device according to the first embodiment of the invention.

FIG. 1 is a schematic diagram of a shock test device 100 according to the first embodiment of the invention. Referring to FIG. 1, a shock test device 100 includes a mainboard 110, a structure unit 120 and a detection module 130. In the embodiment of the invention, the shock test device 100 is mainly used for testing whether an interface card (for example, graphic card or sound card) inserted in an expansion slot of a host computer is stably joined with the expansion slot.

In terms of the current relevant testing technique, in addition to using a connecting finger of an interface card to be joined with the expansion slot, the interface card further has corresponding tenons or slots to increase the friction between the interface card and the slot of the host computer. In this way, a temporal freeing off of the interface card due to shocking as the host computer is being carried or used in mobile state and a resulted abnormal function of the computer can be avoided. However, so far there is no appropriate testing technique to directly judge whether or not the friction between the interface card and the slot of a host computer is sufficient to completely exclude the above-mentioned problem, so that the stability issue is still quite questionable. In order to solve the above-mentioned problem, the embodiment of the invention provides the shock test device 100 of FIG. 1.

The mainboard 110 has a connecting finger 112 disposed at a side of the mainboard 110, in which the mainboard 110 is designed for simulating the basic figure of an interface card, for example, has features of the length and width of the interface card. Since the connecting finger 112 on the mainboard 110 in the shock test device 100 is joined with an expansion slot of a host computer, the pins of the connecting finger 112 must conform to the expansion slot specification to be tested. For example, the expansion slot of the computer system in the embodiment adopts the PCI-E specification, and therefore, the connecting finger 112 must conform to the PCI-E specification, and too long dimension or too short dimension is not allowed. Since different interface card has different complexity of function and different structure, for example, an interface card with more complex function has more chips, capacitors, resistors, fan and power and the like than an interface card with simple structure, so that they have different appearances and different weights. The shock test device 100 of the embodiment uses the structure unit 120 for simulating the weights of the above-mentioned components and the supporting structure.

The structure unit 120 is described as follows. The structure unit 120 includes at least one weight 120a and at least one frame 120b. Since different interface cards have different weights depending on the complexities thereof, the weight 120a is used herein to substitute the weight of a component to be simulated on the interface card. In this way, only a mainboard 110 plus weights 120a are required to simulate various interface cards with different weights located at an expansion slot without purchase a lot of interface cards with different complexities, which can save cost. Moreover, different interface cards not only have different weights, but also have different weight center positions. In the embodiment, the weights 120a can be distributed around on the mainboard 110 to simulate the interface cards with different weight center positions on the expansion slot.

In order to more precisely simulate a real structure of an interface card, the structure unit 120 further uses the frame 120b to simulate a 3-dimensional structure extending out from a surface of the interface card, for example, a height of a cooling fan or fins or large dual in-line package (DIP) capacitors and the like distributed around on the interface card. The shock test device 100 of the embodiment uses the frame 120b disposed at required positions where the 3-dimensional structures are really located at on the mainboard 110 so as to simulate the layout of the 3-dimensional structures on an interface card. The frame 120b is made accordingly with different heights and widths according to the appearances of different components and the frame can be placed at different simulated positions. As a result, the shock test device 100 of the embodiment can broadly simulate various interface cards with different structures.

In general speaking, since the interface card and the expansion slot are joined with each other inside the case of a host computer, people are not easy to directly observe the joining stability between the interface card and the expansion slot. In particular, when an interface card is dropped off, but then reinserted back to the expansion slot again, the real joining is hard to observe. In this regard, the detection module 130 is coupled to at least one pin of the connecting finger 112 for detecting the touch state between the connecting finger 112 and the expansion slot of the host computer and thereby producing a warning signal. For example, the warning signal can be red light of a red LED, in which when a dropping off state or an unstable touch state occurs, the LED emits red light. The user can directly observe the warning signal and is aware of the touch state between the connecting finger 112 and the expansion slot of the host computer.

The shock test device 100 further includes a power supply module 114, which can provide an input power at the power terminal of the shock test device 100. The power supply module 114 herein includes at least one battery, and the input voltage value of the input power is determined by the number of the batteries. For example, if a battery can provide a voltage value of 1.5V and the required input power of the power supply module 114 is 4.5V, then three batteries in serial connection are needed to produce the required voltage value.

Figure 2:
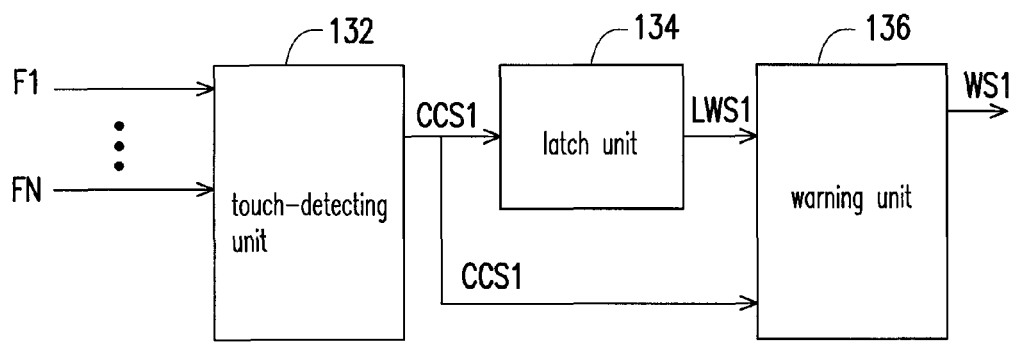
FIG. 2 is a function block chart of a detection module according to the first embodiment of the invention.

FIG. 2 is a function block chart of a detection module 130 according to the first embodiment of the invention. Referring to FIGS. 1 and 2, the detection module 130 includes a touch-detecting unit 132, a latch unit 134 and a warning unit 136. The touch-detecting unit 132 is coupled to at least one pin of the connecting finger 112. In the embodiment, the pins of the connecting fingers 112 (for example, pins F1-FN) inserted to the expansion slot should be electrically connected to the ground pins with PCI-E specification, in which N is a positive integer. When the pins F1-FN of the connecting finger 112 are disconnected from the expansion slot of a host computer, the touch-detecting unit 132 can detected out the altered touch condition of the connecting finger 112, followed by enabling a touch condition signal CCS1. The latch unit 134 is coupled to the touch-detecting unit 132 and the input terminal thereof receives the touch condition signal CCS1. When the touch condition signal CCS1 is enabled, the latch unit 134 is enabled as well and keeps a latch warning signal LWS1. The warning unit 136 is coupled to the touch-detecting unit 132 and the latch unit 134. When the input terminal of the warning unit 136 receives the touch condition signal CCS1 or the latch warning signal LWS1 which are enabled, the warning unit 136 produces a warning signal WS1.

It should be noted that the connecting finger 112 can be disconnected at one of both ends of the connecting finger 112, while another end thereof is not disconnected. To consider the above-mentioned situation, both left and right ends of the connecting finger 112 have corresponding ground pins with PCI-E specification to conduct detection.

Figure 3:
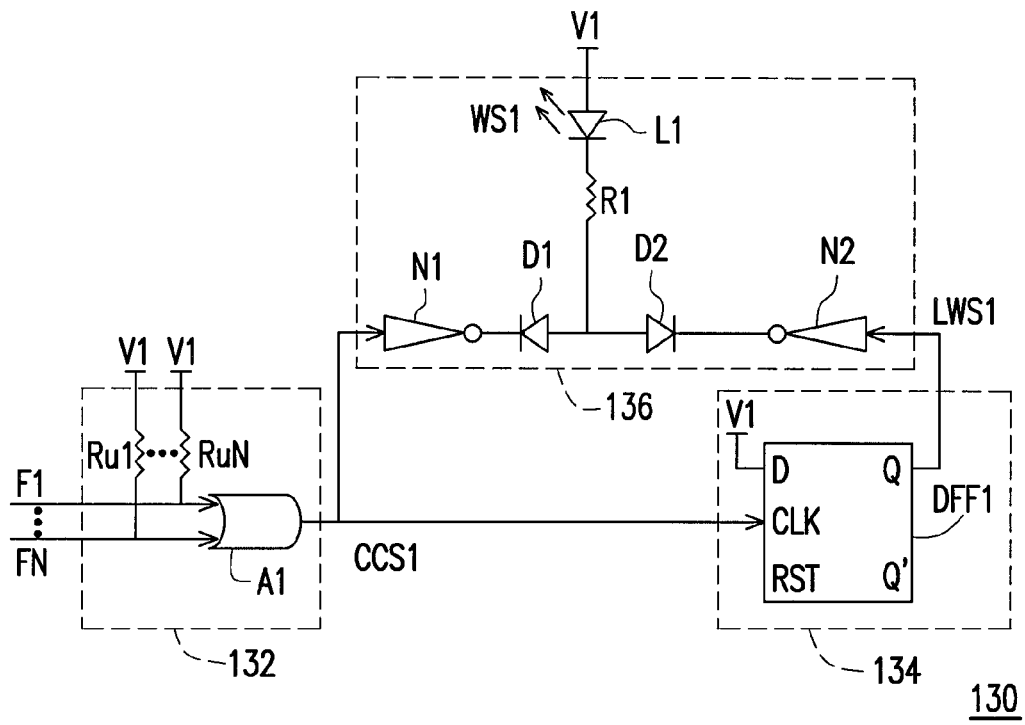
FIG. 3 is a circuit diagram of the detection module according to the first embodiment of the invention.

In more details, FIG. 3 is a circuit diagram of the detection module 130 according to the first embodiment of the invention. Referring to FIG. 3, the touch-detecting unit 132 includes a first OR-gate A1 and at least one of pull-up resistors Rr1-RuN. Each input terminal of the first OR-gate A1 is respectively coupled to one of the ground pins F1-FN of the connecting finger 112 and the output terminal of the first OR-gate A1 produces the touch condition signal CCS1. In addition, the first end of each of the pull-up resistors Ru1-RuN is coupled to a power terminal V1 and the second end of each of the pull-up resistors Ru1-RuN is respectively coupled to one of the above-mentioned ground pins F1-FN of the connecting finger 112.

In other embodiments however, the touch-detecting unit 132 can be coupled to a ground terminal by using at least one power pin coupled to the connecting finger 112 through a pull-down resistor for detecting the touch condition. In fact, the touch-detecting unit 132 of the embodiments of the invention is not limited to the above-mentioned two implementations.

The latch unit 134 includes a D-type flip-flop DFF1. The data input terminal D of the D-type flip-flop DFF1 is coupled to a power terminal V1, the clock input terminal CLK thereof receives the touch condition signal CCS1 and the data output terminal Q thereof produces the latch warning signal LWS1. In addition, the D-type flip-flop DFF1 further includes a reset terminal RST and an inverting data output terminal Q'. By using the reset terminal RST, a user can resume the output of the D-type flip-flop DFF1 back to its initial state. The inverting data output terminal Q' outputs an inverting signal of the one output from the data output terminal Q. Since the D-type flip-flop DFF1 has rising-edge latching function, so that when the touch condition signal CCS1 is at its rising edge, i.e., when the touch condition signal CCS1 is enabled, the D-type flip-flop DFF1 makes an input voltage value of the power terminal V1 transmitted to the data output terminal Q from the data input terminal D and the input voltage value would be kept at the data output terminal Q.

The warning unit 136 includes a first NOT-gate N1, a second NOT-gate N2, a first diode D1, a second diode D2, a first resistor R1 and a first LED L1. The input terminal of the first NOT-gate N1 receives the touch condition signal CCS1 and the input terminal of the second NOT-gate N2 receives the latch warning signal LWS1. The cathode terminal of the first diode D1 is coupled to the output terminal of the first NOT-gate N1 and the cathode terminal of the second diode D2 is coupled to the output terminal of the second NOT-gate N2. The first end of the first resistor R1 is coupled to the cathode terminals of the first diode D1 and the second diode D2. The cathode terminal of the first LED L1 is coupled to the second end of the first resistor R1 and the anode terminal of the first LED L1 is coupled to the power terminal V1.

In this way, when the connecting finger 112 has dropped off from the expansion slot of the host computer and the touch condition thereof is altered, one or a plurality of the ground pins F1-FN coupled to the touch-detecting unit 132 are in floating state due to the dropping off; and at the time, the pull-up resistor Ru would pull up the voltage of the disconnected ground pin to the same voltage of the power terminal V1 and the touch condition signal CCS1 of the first OR-gate A1 would be enabled as well. When the touch condition signal CCS1 received by the warning unit 136 is enabled, the first NOT-gate N1 makes the touch condition signal CCS1 inverted, which converts the state of the first diode D1 into turning on from turning off. As a result, the first LED L1 is turned on and emits light to send out the warning signal WS1.

On the other hand, when the clock input terminal CLK of the D-type flip-flop DFF1 in the latch unit 134 receives the enabled touch condition signal CCS1, the D-type flip-flop DFF1 makes an input voltage value of the power terminal V1 transmitted to the data output terminal Q from the data input terminal D and the voltage value of the data output terminal Q locked at the voltage value of the power terminal V1. Meanwhile, the second diode D2 is turned on through the second NOT-gate N2, and further the first LED L1, due to turning on one of the first diode D1 and second diode D2, emits light.

At the time, if the connecting finger 112 is reconnected to the expansion slot after being dropped off from the expansion slot of the host computer, the above-mentioned disconnected ground pins F1-FN would be ground again and the touch condition signal CCS1 output from the touch-detecting unit 132 is converted to disabling from enabling. Thereby, the first NOT-gate N1 makes the touch condition signal CCS1 inverted so that the first diode D1 is turned off from its turning on state. However, at the time, the voltage at the data output terminal Q of the D-type flip-flop DFF1 is still locked at the voltage value of the power terminal V1, the second diode D2 keeps its turning on state, and the first LED L1 would keep emitting light no matter the connecting finger 112 is reconnected to the expansion slot again after being dropped off from the expansion slot of the host computer. Since when the touch condition signal CCS1 or the latch warning signal LWS1 is enabled, the first LED gets lighting, so that the user can easily observe the dropping off situation of the connecting finger 112 through the D-type flip-flop DFF1 of the latch unit 134 by locking the latch warning signal LWS1.

Figure 4:
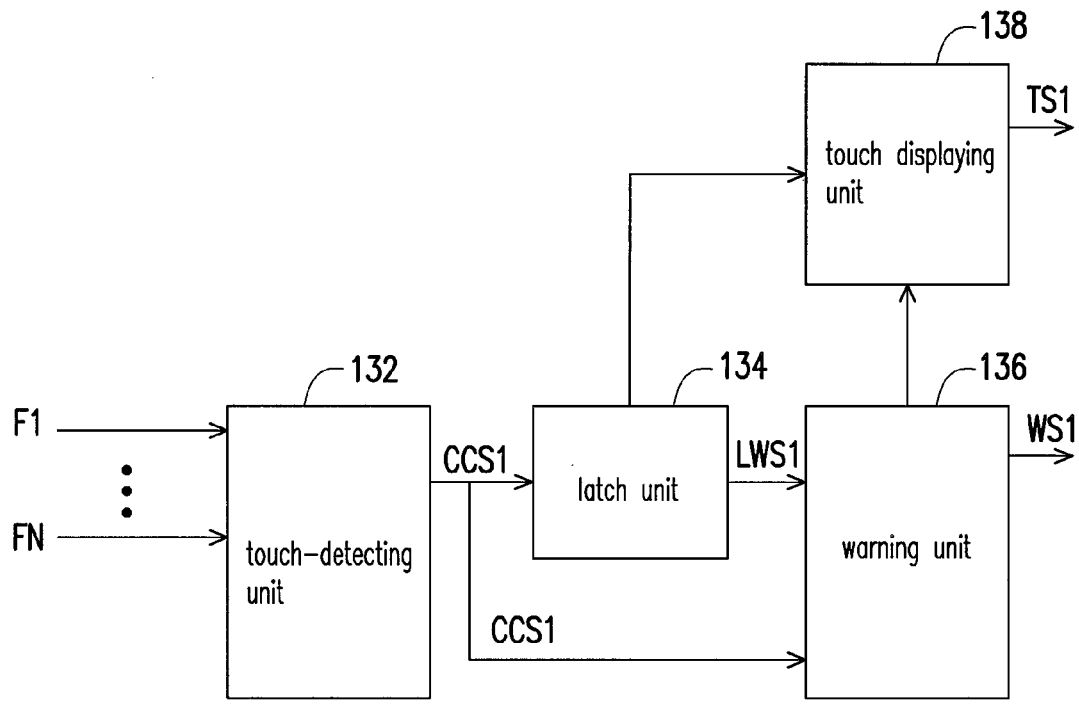
FIG. 4 is a function block chart of a detection module according to the second embodiment of the invention.

FIG. 4 is a function block chart of a detection module 130 according to the second embodiment of the invention. Referring to FIG. 4, different from FIG. 2, a detection module 130 further includes a touch displaying unit 138, which is coupled to the latch unit 134 and warning unit 136. In more details, the input terminal of the touch displaying unit 138 is coupled to the first NOT-gate of the warning unit 136 and the inverting data output terminal of the latch unit 134, and sends out a touch signal TS1 when the touch condition signal CCS1 or the latch warning signal LWS1 is disabled. In the embodiment, the touch signal TS1 is implemented by green light from a green LED. When the touch condition is normal (i.e., in touching state), the green light is sent out serving as the touch signal TS1 and the user is aware of the normal touch condition.

Figure 5:
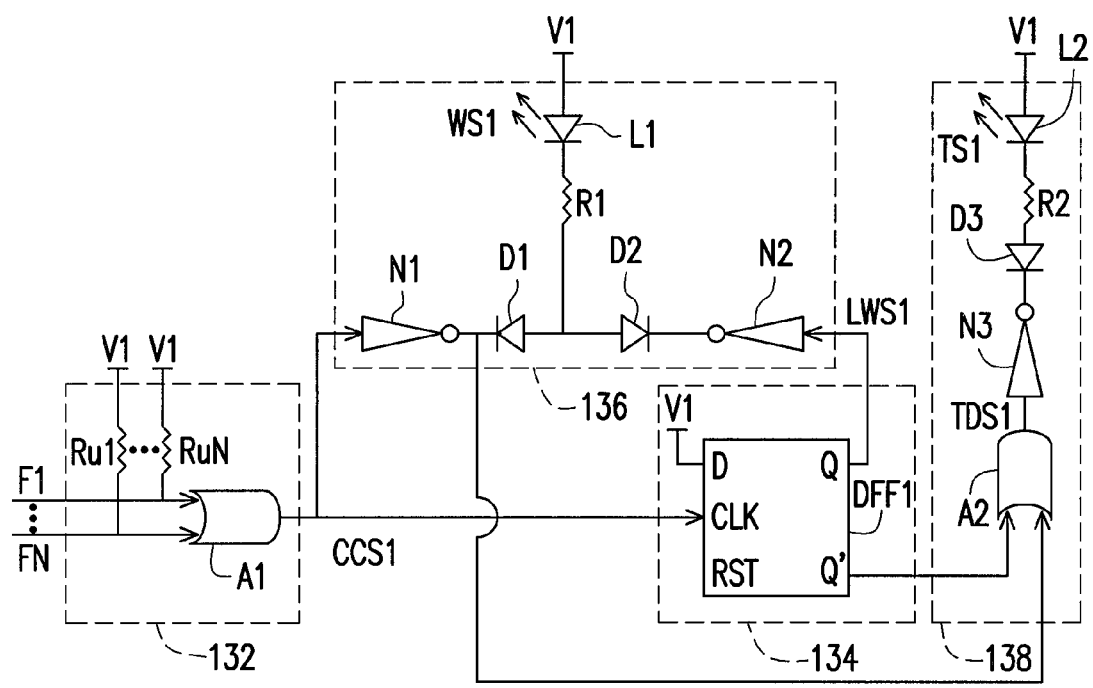
FIG. 5 is a circuit diagram of the detection module according to the second embodiment of the invention.

The second embodiment gives more details about the implementation. FIG. 5 is a circuit diagram of the detection module 130 according to the second embodiment of the invention. Referring to FIG. 5, a touch displaying unit 138 includes a second OR-gate A2, a third NOT-gate N3, a third diode D3, a second resistor R2 and a second LED L2. The first input terminal and the second input terminal of the second OR-gate A2 are respectively coupled to the output terminal of the first NOT-gate N1 and the inverting data output terminal Q' of the D-type flip-flop DFF1 and produces a touch displaying signal TDS1. The third NOT-gate N3 makes the touch displaying signal TDS1 inverted and the cathode terminal of the third diode D3 is coupled to the output terminal of the third NOT-gate N3. The first end of the second resistor R2 is coupled to the cathode terminal of the third diode D3, the cathode terminal of the second LED L2 is coupled to the second end of the second resistor R2, and the anode terminal of the second LED L2 is coupled to the power terminal V1.

When the connecting finger 112 keeps connecting or is reconnected to the expansion slot after being dropped off from the expansion slot of the host computer, the touch condition signal CCS1 enables the touch displaying signal TDS1 through the first NOT-gate N1 and the second OR-gate A2, or enables the touch displaying signal TDS1 through the inverting data output terminal Q' of the D-type flip-flop DFF1. Meanwhile, the third NOT-gate N3 makes the touch displaying signal TDS1 inverted, which turns on the third diode D3 and the second LED L2 gets lighting. By means of lighting or not of the second LED L2, the user can obtain the touch signal TS1 and, through the touch signal TS1, observe and judge whether or not the connecting finger 112 at the time is dropped off from the expansion slot of the host computer.

As description above, the warning signal WS1 produced by the first LED L1 and the touch signal TS1 produced by the second LED L2 can be implemented with different color lights. For example, the first LED L1 can be a red LED and the second LED L2 can be a green LED. When the connecting finger 112 is disconnected from the expansion slot or reconnected to the slot again after being dropped off from the expansion slot of the host computer, the first LED L1 emits a red light of warning signal WS1. When the connecting finger keeps connecting the expansion slot of the host computer at the time, the second LED L2 emits a green light of touch signal TS1. Furthermore, the two diodes (L1 and L2) can be shaded by a photomask, so that when the connecting finger 112 keeps connecting the expansion slot, the photomask gives green light since the first LED L1 is emitting light; when the connecting finger 112 is disconnected from the expansion slot of the host computer, the photomask gives red light since the second LED L2 is emitting light; when the connecting finger 112 is disconnected from and then reconnected to the expansion slot again after being dropped off from the expansion slot of the host computer, both the two LEDs (L1 and L2) emit light, and the photomask would give amber light by mixing the green light with red light. The user or the tester can also use three color lights to distinguish the touch condition of the connecting finger 112.

It should be noted that an embodiment of the invention can dispose the LEDs at the shock test device or outside the case of a host computer. The user can be aware of the touch condition only through the warning signal or the touch signal sent out from the LEDs without opening the case. Moreover, if the test is conducted under running state of the computer, i.e. the shock test is conducted as the operation system of the host computer is started, the warning signal or the touch signal is sent to the host computer and a detection software can be used to receive the corresponding signals, the user thus can easily know the touch condition of the connecting finger in the shock test device through operating the detection software. The description above is one of the embodiments about using the warning signal or the touch signal, which the invention is not limited to.

In summary, in the shock test device of the embodiments of the invention, hardware components of the weight and the frame are used to simulate the weight of the external card and the supporting structure, and the detection module is used for detecting whether or not a link plug-in in a host computer is disconnected due to shocking or the connecting finger of the shock test device is unseen disconnected and then connected back or so on. In particular, when the connecting finger of the shock test device is disconnected due to shocking, a warning signal is produced to inform the tester. Moreover, the user can easily observe the touch condition by the warning signal and the touch signal through different color lights or through other methods.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A shock test device, suitable for an expansion slot of a computer system and comprising:
 a mainboard, having a connecting finger electrically connected to the expansion slot;
 a structure unit, disposed at the mainboard for simulating a weight and a supporting structure; and
 a detection module, coupled to at least one pin of the connecting finger for detecting a touch condition between the connecting finger and the expansion slot so as to produce a warning signal, wherein the detection module comprises:
  a touch-detecting unit, couple to the at least one pin for enabling a touch condition signal when the at least on pin is disconnected from the expansion slot;
  a latch unit, coupled to the touch-detecting unit for receiving the touch condition signal and enabling and keeping a latch warning signal when the touch condition signal is enabled, wherein the latch unit comprises:
   a D-type flip-flop having a data input terminal, a clock input terminal and a data output terminal, wherein the data input terminal thereof is couple to a power terminal, the clock input terminal thereof receives the touch condition signal and the data output terminal thereof produces the latch warning signal; and a warning unit, coupled to the touch-detecting unit and the latch unit for producing the warning signal when the touch condition signal is enabled or the latch warning signal is enabled.

2. The shock test device as claimed in claim 1, wherein the structure unit comprises:

at least one weight for simulating the weight of the shock test device; and at least one frame for simulating the supporting structure of the shock test device and a mainboard height of the shock test device.

3. The shock test device as claimed in claim 1, wherein the at least one pin of the connecting finger is for coupling at least one ground pin of the expansion slot, and the touch-detecting unit comprises:

a first OR-gate having a plurality of input terminals and an output terminal, wherein each of the input terminals is respectively coupled to the at least one pin of the connecting finger and the output terminal of the first OR-gate produces the touch condition signal; and at least one pull-up resistor having a first terminal and a second terminal, wherein the first terminal of each of the pull-up resistors is coupled to a power terminal and the second terminal of each of the pull-up resistors is respectively coupled to the at least one pin.

4. The shock test device as claimed in claim 1, wherein the warning unit comprises:

a first NOT-gate having an input terminal and an output terminal, wherein the input terminal receives the touch condition signal;

a second NOT-gate having an input terminal and an output terminal, wherein the input terminal receives the latch warning signal;

a first diode having a cathode terminal, wherein the cathode terminal is coupled to the output terminal of the first NOT-gate;

a second diode having a cathode, wherein the cathode terminal is coupled to the output terminal of the second NOT-gate;

a first resistor having a first end and a second end, wherein the first end is coupled to the first diode and the cathode terminal of the second diode; and a first light-emitting diode having a cathode terminal and an anode terminal, wherein the cathode terminal is coupled to the second end of the first resistor and the anode terminal is coupled to a power terminal.

5. The shock test device as claimed in claim 4, wherein the warning unit further comprises:

a touch displaying unit, coupled to the first NOT-gate and an inverting data output terminal of the latch unit for sending out a touch signal when the touch condition signal or the latch warning signal is disabled.

6. The shock test device as claimed in claim 5, wherein the touch displaying unit comprises:

a second OR-gate having a first input terminal and a second input terminal, wherein the first input terminal and the second input terminal are respectively coupled to the output terminal of the first NOT-gate and the inverting data output terminal to produce a touch displaying signal;

a third NOT-gate having an output terminal for inverting the touch displaying signal;

a third diode having a cathode terminal, wherein the cathode terminal is coupled to the output terminal of the third NOT-gate;

a second resistor having a first end and a second end, wherein the first end is coupled to the cathode terminal of the third diode; and a second light-emitting diode having a cathode terminal and an anode terminal, wherein the cathode terminal is coupled to the second end of the second resistor and the anode terminal of the second light-emitting diode is coupled to the power terminal.

7. The shock test device as claimed in claim 1, wherein the shock test device further comprises a power supply module for providing an input power at the power terminal of the shock test device.

8. The shock test device as claimed in claim 1, wherein the above-mentioned expansion slot conforms to a peripheral component interconnect express (PCI-E) specification.

* * * * *